SINGLE DIFFUSED SURFACE TRANSISTOR AND METHOD OF MAKING SAME

Filed Dec. 22, 1965

INVENTORS
RAYMOND P. PECORARO
OREST BILOUS

BY Sughrue, Rothwell, Mion, Zinn & Macpeak
ATTORNEYS

United States Patent Office 3,445,734

Patented May 20, 1969

3,445,734

SINGLE DIFFUSED SURFACE TRANSISTOR AND METHOD OF MAKING SAME

Raymond P. Pecoraro, Wappingers Falls, and Orest Bilous, Beacon, N.Y., assignors to International Business Machines Corporation, Armonk, N.Y., a corporation of New York Filed Dec. 22, 1965, Ser. No. 515,411

Int. Cl. H01l 11/00

U.S. Cl. 317—235 9 Claims

ABSTRACT OF THE DISCLOSURE

A junction transistor having a direction of carrier flow, which is parallel to the transistor surface, is formed using a single diffusion step. The collector and emitter regions are formed by simultaneous diffusion through a pair of holes in a silicon dioxide mask into an epitaxially grown base region. The relative position of the two holes in a mask and the diffusion into the epitaxial layer is such that the two diffused regions are separated by a base width which is sufficient to allow the device to operate as a junction transistor.

The invention relates to a transistor in which the emitter-base and collector-base junctions appear at a single surface thereof and are formed by the diffusion of impurities into a semiconductor layer which serves as the transistor base. Also, the invention relates to a semiconductor device having emitter, base and collector regions, wherein the emitter and collector regions are formed by diffusion into the base region, and the device is operable as a conventional junction transistor having minority carrier flow, a field effect transistor having no minority carrier flow and a conventional junction transistor with transconductance characteristic control.

Diffused planar transistors are known in the prior art and they are fabricated by the steps of masking a first layer of semiconductive material which serves as the collector region; forming a base region by diffusion through a hole in the mask; forming the emitter region by diffusion through a newly formed mask which covers the device surface except for a portion of the surface area of the latter formed base region.

In the present invention, only a single diffusion step is necessary to form the emitter-base and the base-collector junctions. Aside from the important advantage of reducing the number of steps and complexity of transistor fabrication, other advantages include the ability of the device to be used as a field effect transistor or as a conventional junction transistor, a lower base resistance and consequently more rapid switching action, large breakdown voltages for the emitter base and collector base junctions and symmetry of the device.

In the prior art of diffused transistors, the collector layer is usually epitaxially grown, the base region is diffused into the collector layer, and subsequently the emitter region is diffused into the base region. This contrasts significantly with the present invention wherein the base layer is epitaxially grown, and the emitter and collector regions are formed simultaneously by diffusion into the base layer. The base width between the emitter base junction and the collector base junction may be controlled to a high degree of tolerance by presently available diffusion and masking techniques. Since the base layer is grown rather than diffused, it is much larger than the base regions of the prior art diffused transistors. As a consequence of the latter feature, the base contact area may be much greater with the result of substantial reduction of base resistance. Since a lower base resistance means faster transistor operation, the transistors of the present invention are faster in operation than those of the prior art.

Since the emitter and collector regions are formed by the same diffusion step, symmetry may be achieved by simply making the hole in the mask through which the emitter region is formed equal in size to the hole in the mask through which the collector region is formed. The two diffused regions will then have the same geometry and size resulting in a symmetrical transistor. Symmertical transistors are desirable in integrated circuit designs since either side may be used as the emitter junction. It should be noted that the transistor of the present invention need not be symmetrical, but may be made asymmetrical by merely increasing the size of one of the holes in the oxide mask.

An additional feature, as mentioned above, is that of higher junction breakdown voltages. Breakdown voltages of approximately 40 volts may be achieved for both the emitter-base and collector-base junctions, whereas the emitter breakdown voltages in the prior art transistors are approximately 6 volts.

Another difference between the prior art diffused transistors and the present invention is the ability of the present invention to be used as a field effect transistor. In the prior art diffusion transistors, the emitter to collector current path crosses the critical base width in a direction perpendicular to the transistor surface whereas in the present invention the emitter to collector current path is parallel to the surface. As a result, by disconnecting the base contact and by applying a gating contact to an oxide coating which overlies the base width in between the two junctions, a field effect transistor is formed. Furthermore, if the base contact and the aforementioned gate contact are used, the device will act as a conventional junction transistor with the exception that potentials applied to the gate or grid electrode control the device transconductance characteristics.

One further feature of the invention is a buried layer of similar conductivity to the base layer and physically positioned just below the emitter and collector regions. The buried layer serves to further reduce the base resistance.

It is therefore an object of the present invention to provide a new method for making diffused planar transistors. It is a further object of the present invention to provide a new and improved diffused junction transistor.

An additional object of the invention is the production of a junction transistor capable of operating as a field effect device.

A still further object of the invention is the production of a new and useful diffused junction transistor having improved operating characteristics.

In one particular embodiment the invention is the method and the device produced by the method comprising the steps of, epitaxially growing a layer of a first type conductivity semiconductive material on a substrate; masking the surface of the epitaxially grown layer with an oxide coating having two openings therein, diffusing opposite type conductivity regions into said epitaxial layer through the openings in the mask, and forming metallic contacts to the epitaxial layer and the two diffused regions at the upper surface of the device.

Other objects of the invention will be pointed out in the following description and claims and illustrated in the accompanying drawings, which disclose, by way of example, the principle of the invention and the best mode which has been contemplated of applying that principle.

Figure 1A:
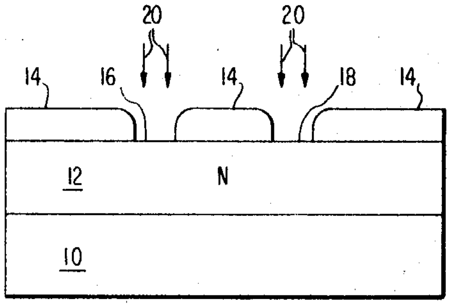
FIGURE 1A is a cross-sectional side view of a device made during an intermediate step of the process of the present invention.
Figure 1B:
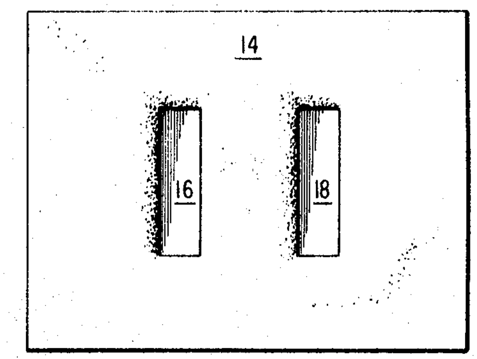
FIGURE 1B is a top view of the device shown in FIGURE 1A.

In the detailed description of the invention, the formation of a PNP transistor will be described. However, it should be understood that the invention applies equally as well to an NPN transistor. With reference to FIGURES 1A and 1B there is shown a epitaxially grow N-type layer 12 which is grown on a substrate 10. The N-type epitaxially grown layer 12, which will later serve as the transistor base region, is covered with an oxide mask 14 as is well known in the art.

Portions of the mask 14 are removed to expose surfaces 16 and 18 of the base layer 12. The emitter and collector regions are then formed by diffusing impurities, indicated by arrows 20, into the layer 12 at surfaces 16 and 18.

Figure 2A:
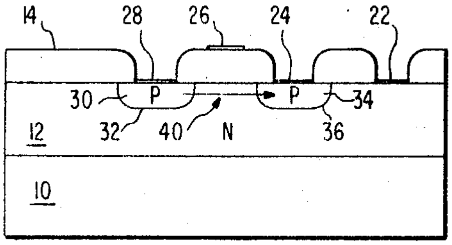
FIGURE 2A is a cross-sectional side view of a preferred embodiment of the present invention.

The diffused P-type regions 30 and 34, shown in FIGURE 2A, are formed during the above-described single diffusion step and serve as the emitter and collector regions of the PNP transistor. Particular diffusion techniques for forming a P-type region in an N-type layer, or for forming an N-type region into a P-type layer, are well known in the art and require no further explanation in the present application. After the emitter and collector regions are formed, metallic contacts 24 and 28 may be formed on the surfaces thereof by techniques well known in the art. The metallic contacts 24 and 28 serve as the emitetr and collector contacts of the finished product. An additional portion of the oxide coating 14, overlying the base layer 12, may be removed so that the base contact 22, shown in FIGURES 2A and 2B, may be applied to the surface of the base layer. Furthermore, a metallic gate or grid contact 26 may be applied to the oxide layer 14 directly above the base width which separates the emitter and collector regions.

In order for the PNP device to operate as a conventional junction transistor, it is necessary that the base width separating the emitter base junction 32 and the collector base junction 36 be within certain definite limits. The emitter to collector current path of the PNP transistor shown in FIGURE 2A is indicated by arrow 40. The base width of interest is that which is intersected by the current path. In conventional junction transistors the emitter injects carriers into the base region which diffuse across and are collected by the collector region. If the base width between the emitter and collector regions is too wide the carriers injected by the emitter into the base will combine with the majority carriers in the base and will therefore not be collected by the collector. The result is that the device will not operate as a conventional transistor. The upper limit on the base width is about 2.0 microns. Present-day masking and diffusion techniques are sufficiently well advanced to allow the formation of regions 30 and 34 having less than 2.0 microns separation.

The minimum base width separation of the emitter and collector regions is determined by the depletion regions surrounding the junctions 32 and 36. Each PN junction has a very small depletion width on both sides thereof. If the emitter and collector regions are so close that the junction depletion regions meet, the base width separating the two junctions will be entirely depleted and therefore will not support transistor action. As is well known in the art, the base width is the width between the edges of the depletion regions and the depletion regions are of the order of one micron. The minimum base width is determined by the junction depletion regions and must be large enough to avoid punch through under operating conditions. The typical base width on prior art transistors is about 2,500 A. to 3,500 A.

Since the size of a diffused region depends upon the diffusion time and the size of the mask openings, regions 30 and 34 will be of identical geometry if the mask openings are of equal size. Consequently, symmetrical transistors may be easily fabricated by making the mask openings of equal size. If the transistor shown in FIGURE 2A is symmetrical, either region 30 or region 34 may be used as the emitter, the other serving as the collector region. One of the particular advantages of symmetrical transistors is that the positioning requirements in integrated circuitry are not as strict as they are for non-symmetrical transistors.

Figure 2B:
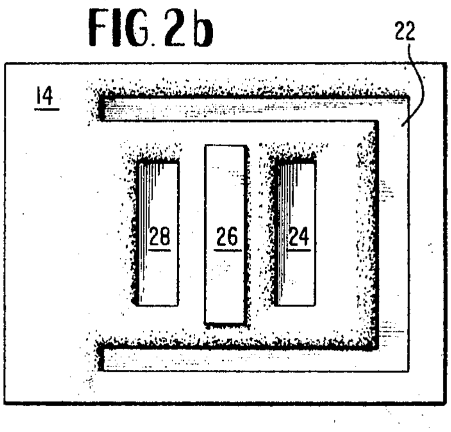
FIGURE 2B is a top view of the device illustrated in FIGURE 2A.

In FIGURES 2A and 2B, four separate contacts are indicated. As previously mentioned, contacts 28 and 24 serve as the emitter and collector contacts, and contact 22 serves as the base contact. Since the emitter to collector current path is parallel to the surface, the additional metallic contact 26, which overlies the narrow base width, will serve as the gate electrode, thus permitting field effect operation (with base contact 22 disconnected), or transconductance characteristics variation (with the base contact 22 being used). When only contacts 24, 26 and 28 are used, the device operates as a typical MOS field effect transistor.

Since the surface of the base layer is very large compared to that of the prior art diffusion transistors, the base contact area, to which contact 22 is connected, may be made very large. The desirability of a large base contact area lies in the fact that a larger base contact area creates a lower base resistance which in turn increases the frequency of operation of the device.

Figure 3:
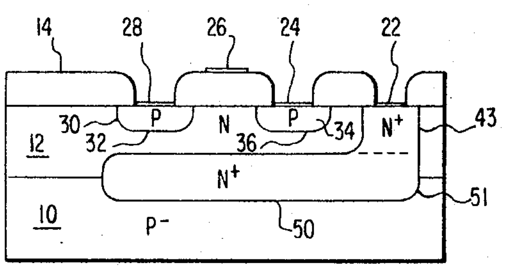
FIGURE 3 is a cross-sectional side view of a second embodiment of the present invention.

It has also been found that the total base resistance of the transistor may be further reduced by diffusing an $N^+$ buried layer in the device underlying the emitter and collector regions. In FIGURE 3, buried layer 50 comprises portions 51 and 43 of $N^+$ conductivity. As is well known in the art, the terms N, $N^-$, $N^+$, P, $P^-$, and $P^+$ represent known concentrations of acceptor or donor atoms in the semi-conductor material. The concentrations are: $N=10^{17}-10^{19}$ atoms/cm.$^3$; $N^+=10^{21}$ atoms/cm.$^3$; $P^-=10^{15}$ atoms/cm.$^3$; $P=10^{19}$ atoms/cm.$^3$; $P^+=10^{20}$ atoms/cm.$^3$.

Referring again to FIGURE 3, portion 51 of buried layer 50 is formed by diffusion into the $P^-$ substrate layer 50 prior to epitaxially growing the N layer 12. Portion 43 of buried layer 50 is then formed by diffusion into the layer 12 as shown. The base contact 22 may be applied directly to the portion of buried layer 50 which reaches the surface. Viewing the device of FIGURE 3 from above, the $N^+$ region which reaches the surface may have the same configuration as the electrode 22 of FIGURE 2B.

The resistance of the buried layer 50 is about $2\Omega/\square$, causing the total base resistance of the device to be about 5–10Ω as compared with about 20Ω or greater for conventional devices.

It should be noted that in construction of an NPN transistor, the buried layer would be of type $P^+$. Also, the emitter and collector diffusion may come prior or subsequent to the diffusion of portion 43.

Although the above description pertains to the formation of a single transistor, it will be apparent to those skilled in the art that multiple transistor production on a single substrate is possible. While the invention has been particularly shown and described with reference to preferred embodiments thereof, it will be understood by those skilled in the art that the foregoing and other changes in form and details may be made therein without departing from the spirit and scope of the invention.

What is claimed is:

1. A method for forming a diffused planar transistor comprising the steps of (a) forming a mask having two openings therein on the surface of a semiconductor layer of a first type of conductivity, and (b) simultaneously diffusing impurities into said layer through said openings forming two second-type conductivity regions to form a base width of 1000 A. to 3000 A. therebetween, where said first and second type conductivities are opposite, (c) applying metal contacts to said two regions at the surfaces thereof, and (d) applying a metal contact to the surface of said layer, said latter metal contact substantially surrounding the surfaces of said two regions, and (e) applying a metal contact to the portion of said mask which overlies the surface of said layer separating said two regions.

2. The method as claimed in claim 1 wherein said semiconductor layer is of N-type conductivity and said two regions are of P-type conductivity.

3. The method as claimed in claim 1 wherein said semiconductor layer is of P-type conductivity and said two regions are of N-type conductivity.

4. A method of forming a diffused planar transistor comprising the steps of (a) diffusing into a substrate semiconductive layer an impurity to form a buried layer having a first type conductivity, (b) epitaxially growing a base layer of said first type conductivity on said substrate and said buried layer, (c) simultaneously diffusing impurities into said base layer to form two regions of a second type conductivity, said two regions being separated by a width of said base layer of 1000 A. to 3000 A., (d) applying metal contacts to said two regions at the surfaces thereof, (e) applying a metal contact to the surface of said base layer, said latter metal contact substantially surrounding the surfaces of said two regions, (f) forming an oxide coating on the surface of said base layer overlying the width of said base layer which separates said two regions, and (g) applying a metal contact to said oxide coating.

5. A semiconductor device comprising (a) a substrate layer, (b) an epitaxially grown base layer of semiconducting material having a first type conductivity overlying said substrate layer, (c) first and second regions of a second type conductivity, said first and second regions being diffused into said base layer forming an emitter and collector region respectively and a base width therebetween of 1000 A. to 3000 A., said base, emitter and collector regions all having surfaces in a single plane for contact with electrodes, (d) first and second metallic contacts ohmically connected to said emitter and collector regions respectively at the surfaces thereof, (e) a third metallic contact ohmically connected to said base layer at the surface thereof, said third metallic contact substantially surrounding said first and second metallic contacts, (f) an oxide coating on said base layer surface overlying the region of said base layer which separates said emitter and collector regions, and (g) a fourth metallic contact overlying said oxide coating.

6. A semiconductor device as claimed in claim 5 further comprising (a) a buried layer of semiconductive material having said first type conductivity diffused into said substrate and underlying said emitter and collector regions, said buried layer having a greater concentration of diffusant atoms than said base layer.

7. A semiconductor device as claimed in claim 6 further comprising a diffused conductivity region of the same conductivity and concentration as said buried layer extending through said epitaxially grown layer from said plane to said buried layer.

8. A semiconductor as claimed in claim 7 wherein said emitter and collector regions are of N-type conductivity, said base layer is of P-type conductivity, and said buried layer is of $P^+$ type conductivity.

9. A semiconductor as claimed in claim 7 wherein said emitter and collector regions are of P-type conductivity, said base layer is of N-type conductivity, and said buried layer is of $N^+$ type conductivity.

References Cited

UNITED STATES PATENTS

| | | | |
|---|---|---|---|
| 2,801,348 | 7/1957 | Pankore | 307—88.5 |
| 2,900,531 | 8/1959 | Wallmark | 307—88.5 |
| 2,993,126 | 7/1961 | Dorandorf | 307—88.5 |
| 2,995,665 | 8/1961 | Rutz | 307—88.5 |
| 3,246,214 | 4/1966 | Hugle | 317—2235 |
| 3,311,756 | 3/1967 | Nagata et al. | 307—88.5 |

JOHN W. HUCKERT, *Primary Examiner.*

R. F. SANDLER, *Assistant Examiner.*

U.S. Cl. X.R.

29—571